(12) United States Patent
Rovik et al.

(10) Patent No.: US 6,854,853 B2
(45) Date of Patent: Feb. 15, 2005

(54) METHOD FOR WAVE SOLDERING OF SURFACE MOUNTED LIGHT EMITTING DIODES

(75) Inventors: Christopher L. Rovik, Canton, MI (US); Wesley R. Corrion, Fenton, MI (US); Ricardo Hernandez, Canton, MI (US); Adrian G. Gheorghiu, Troy, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/390,269

(22) Filed: Mar. 17, 2003

(65) Prior Publication Data

US 2004/0184255 A1 Sep. 23, 2004

(51) Int. Cl.[7] .............................................. G01D 11/28
(52) U.S. Cl. ............................ 362/23; 362/26; 362/800
(58) Field of Search .............................. 362/23, 26, 27, 362/800; 116/286, 287, 288, 310, DIG. 35, DIG. 36; 174/250–268

(56) References Cited

U.S. PATENT DOCUMENTS

| | | | | |
|---|---|---|---|---|
| 5,920,462 A | * | 7/1999 | Glovatsky et al. | 361/760 |
| 6,549,179 B2 | * | 4/2003 | Youngquist et al. | 345/39 |
| 6,663,251 B2 | * | 12/2003 | Calvert | 362/23 |
| 2001/0025596 A1 | | 10/2001 | Komura | |
| 2002/0002941 A1 | | 1/2002 | Nakane | |

FOREIGN PATENT DOCUMENTS

| | | |
|---|---|---|
| JP | 06314858 | 11/1994 |
| JP | 2001-066161 | 3/2001 |
| JP | 2002-076602 | 3/2002 |

OTHER PUBLICATIONS

English Abstract for JP2002-076602.
English Abstract for JP2001-066161.
English Abstract for JP06314858.

* cited by examiner

*Primary Examiner*—Sandra O'Shea
*Assistant Examiner*—Mark Tsidulko
(74) *Attorney, Agent, or Firm*—Brinks Hofer Gilson & Lione

(57) ABSTRACT

An instrument cluster for communicating a vehicle's operating status to a vehicle occupant is disclosed. The instrument cluster includes a housing for supporting the instrument cluster. The housing is mountable to a vehicle instrument panel. A circuit board is secured to the housing. A motor having a motor shaft is rotatably coupled to the motor and the motor is secured to the circuit board. A gauge pointer is mounted on the motor shaft and rotatable therewith for indicating the vehicle's operating status. At least one diode is provided for illuminating the gauge pointer and at least one diode "footprint" is disposed on the circuit board proximate the motor shaft for electrically interconnecting the at least one diode to the circuit board. The at least one diode "footprint" has a cathode solder pad and an anode solder pad. The anode solder pad is substantially rectangular and the cathode solder pad is substantially L-shaped.

12 Claims, 3 Drawing Sheets

METHOD FOR WAVE SOLDERING OF SURFACE MOUNTED LIGHT EMITTING DIODES

TECHNICAL FIELD

The present invention relates to systems and methods for soldering Light Emitting Diodes (LEDs) on circuit boards for use in automobile instrument clusters and to methods for forming the electrical interconnection of LEDs to circuit boards.

BACKGROUND

Automotive instrument panels typically include a plurality of gauges for providing vital vehicle status and operating information to a vehicle operator. These instrument panels typically have an instrument cluster constructed of polymer housing, a circuit board, a gauge appliqué, and an instrument cluster lens. The instrument cluster circuit boards include the electrical circuits and devices that control and illuminate the gauges and/or instrument cluster pointers. Generally, stepper motors are mounted on or proximate to the instrument cluster circuit boards and are mechanically connected to the gauge pointers to rotate the gauge pointers across the face of the gauge appliqué. The instrument cluster lens is typically transparent and is positioned between a vehicle occupant and the gauge appliqué.

Driven by styling concerns, a high impact instrument cluster has been designed having a semi-transparent instrument cluster lens. One problem stemming from the introduction of these high impact instrument clusters and semi-transparent lenses is that the gauge pointers must be brighter than in previous instrument cluster designs. Current designs incorporate as many as four LEDs around the motor shaft and base of the gauge pointer. However, circuit board space limitations require the use of convection solder reflow technology to solder the LEDs to the circuit board. Additionally, the problem is compounded by the fact that many of the circuit boards are also subjected to a convection solder reflow soldering process on the opposite side of the board. This double reflow process can cause quality and reliability issues for many of the electronic components due to the sustained exposure to elevated temperature levels.

Therefore, there is a need for a new and improved system and method for providing enhanced illumination to instrument cluster gauge pointers. The new and improved method should not cause quality and reliability concerns due to exposure to elevated process temperatures.

SUMMARY

The present invention provides a method for orienting LEDs on a instrument cluster circuit board in such a way that will allow maximum light energy to illuminate the gauges pointer. In one embodiment of the present invention, a solder pad design is provided that is compatible with wave soldering. The issues associated with a double reflow process are eliminated.

In another embodiment, an instrument cluster for communicating a vehicle's operating status to a vehicle occupant is provided. The instrument cluster includes a housing for supporting the instrument cluster. The housing is mountable to a vehicle instrument panel. A circuit board is secured to the housing. A motor having a motor shaft is rotatably coupled to the motor and the motor is secured to the circuit board. A gauge pointer is attached to the motor shaft and rotates with the motor shaft for indicating the vehicle's operating status. At least one diode is provided for illuminating the gauge pointer and at least one diode "footprint" having at least one solder pad is disposed on the circuit board proximate the motor shaft for electrically interconnecting the at least one diode to the circuit board. The at least one "footprint" has a cathode solder pad and an anode solder pad. The anode solder pad is substantially rectangular and the cathode solder pad is substantially L-shaped.

In another embodiment of the present invention, a single "footprint" design is provided that is compatible with a major gauge containing four LEDs while accommodating the complex orientation of the separate motor electrical connections.

In yet another embodiment of the present invention, a diode "footprint" design is provided that may be used in minor gauges, as well as, major gauges where the minor gauges contain only two LEDs due to its small angular sweep of approximately 90°. Thus, the present invention provides a more robust design through the optimization of component solder pad geometries.

These and other aspects and advantages of the present invention will become apparent upon reading the following detailed description of the invention in combination with the accompanying drawings.

DETAILED DESCRIPTION

Figure 1:
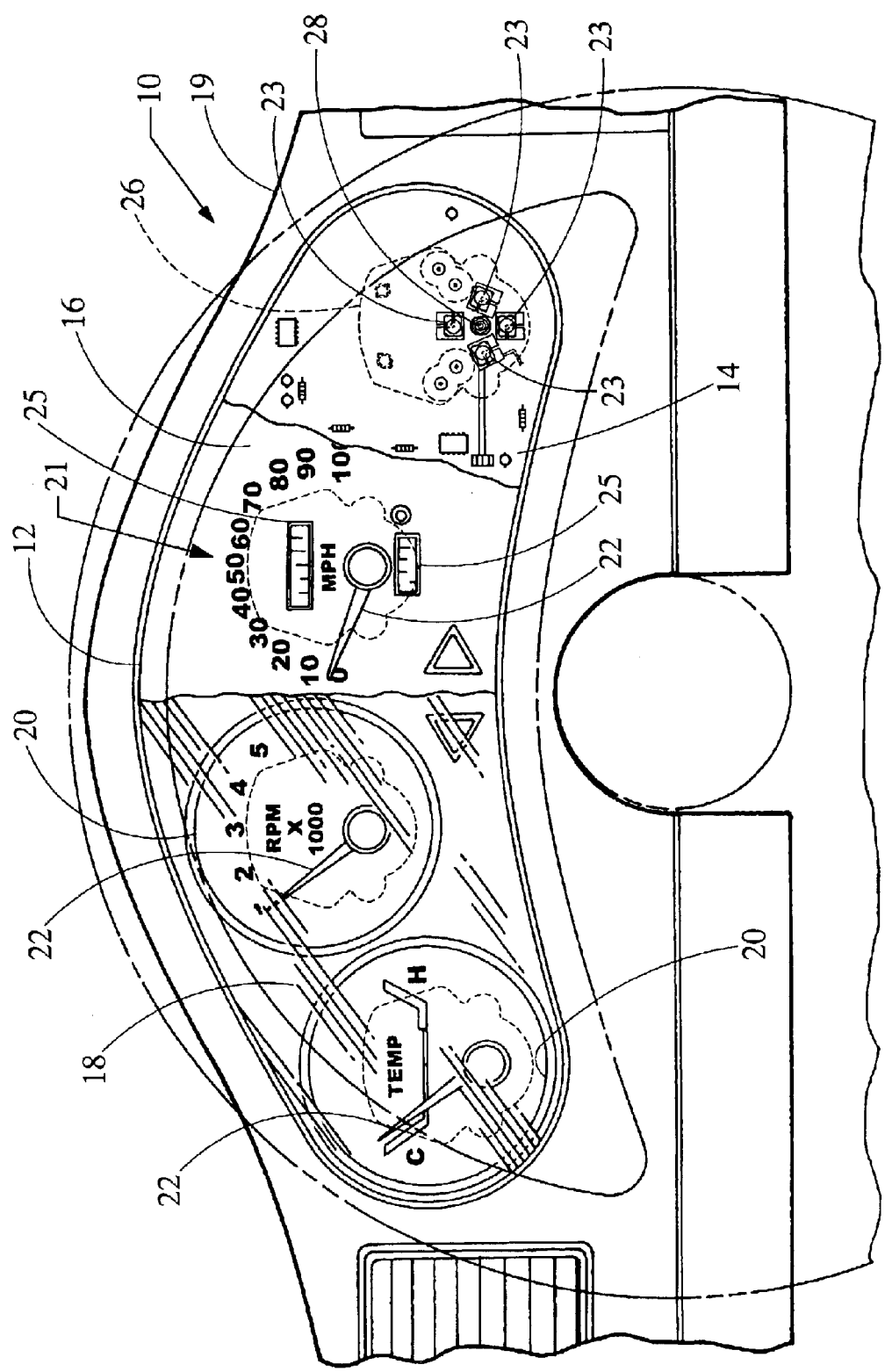
FIG. 1 is a perspective view of an instrument cluster illustrating in partially cut-away view portions of a gauge appliqué and an instrument cluster circuit board, in accordance with the present invention.

Referring now to FIG. 1, a perspective view of an instrument cluster 10 is illustrated, in accordance with the present invention. Instrument cluster 10 includes a housing 12, circuit board 14, gauge appliqué 16, and instrument cluster lens 18. Housing 12 is configured to mount to a vehicle instrument panel 19. Circuit board 14 includes features for attaching the circuit board to housing 12, such as mounting through-holes that accommodate screws, rivets or the like. Circuit board 14 includes a plurality of electrical components and circuit traces for supporting and producing vehicle operation and/or status information presented through gauge appliqué 16. For example, light emitting diodes (LED) may be mounted to circuit board 14 for illuminating various portions of appliqué 16. As will be further illustrated, appliqué 16 includes various markings 21 and apertures 25 which form the face of a gauge 20.

Typically, a gauge pointer 22 sweeps across the face of gauge 20 and provides a means for indicating information regarding vehicle operation and or status, such as a fluid level, temperature, speed, etc. Pointers 22 are typically illuminated by a series of diodes or LEDs 23 mounted and electrically interconnected to circuit board 14. An electric stepper motor 26, indicated by dashed line, is mounted to the back side of circuit board 14. Motor 26 has a motor shaft 28 that is rotated by the motor when the motor is activated. Pointer 22 is coupled to motor shaft 28 and thus rotates with the motor shaft. In an embodiment of the present invention, motor 26 is mechanically mounted to circuit board 14 using heat stakes or other suitable mechanical fastening means.

Lens 18 may be constructed of a transparent or a semi-transparent polymer material. However, depending on the transparency of lens 18, the number of diodes provided for illuminating pointers 22 may need to be increased in number. For example, a more transparent lens 18 may only require two LEDs while a semi-transparent lens may require four LEDs to sufficiently illuminate pointer 22.

Figure 2:
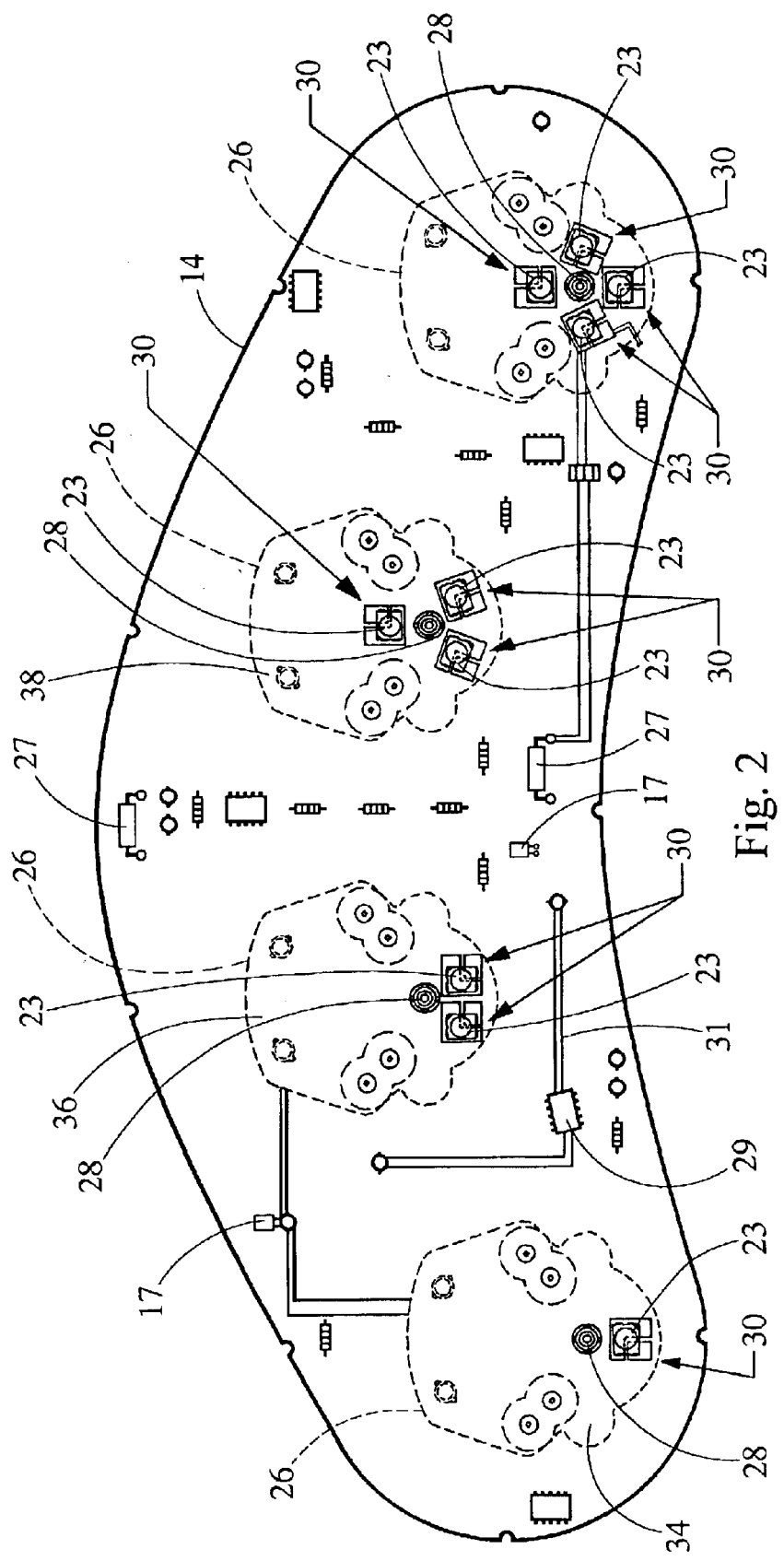
FIG. 2 is a perspective view of an instrument cluster circuit board illustrating the various embodiments of the invention where one, two, three and four LEDs are positioned around the shaft of stepper motors, in accordance with the present invention.

Referring now to FIG. 2, a perspective view of circuit board 14 is illustrated, in accordance with the present invention. Generally, circuit board 14 includes a variety of electrical components, such as diodes 23, transistors 17, resistors 27, processors 29, as well as, circuit conductors or traces 31 for interconnecting the electronic components to form instrument cluster control circuitry. Of particular interest in the present invention, are the light emitting diodes that illuminate pointers 22 and the electrical interconnectors or "footprints" 30 that electrically interconnect LEDs 23 to circuit board 14. Typically, LEDs 23 are located a minimum distance (approximately 4.5 mm) from motor shaft 28 of stepper motor 26 in order to provide sufficient illumination of pointer 22. Further, the size or overall length of pointer 22 will vary depending on the size of gauge 20. Generally, the larger the gauge, the larger the pointer. Larger pointers require more LEDs 23 to sufficiently illuminate the pointer along the entire length of the pointer. For example in FIG. 2, minor gauges 34 and 36 may only require one and two LEDs 23 to illuminate their respective gauge pointers. While a third gauge 38 may require three LEDs 23 to illuminate pointer 22. However, in each of the various minor and major gauge configurations, the present invention provide one diode "footprint" 30 design or configuration. In order to provide the proper amount of illumination to each gauge and pointer, the solder pads should be configured, as well as, positioned about shaft 28 in order to support higher energy output LEDs.

Figure 3:
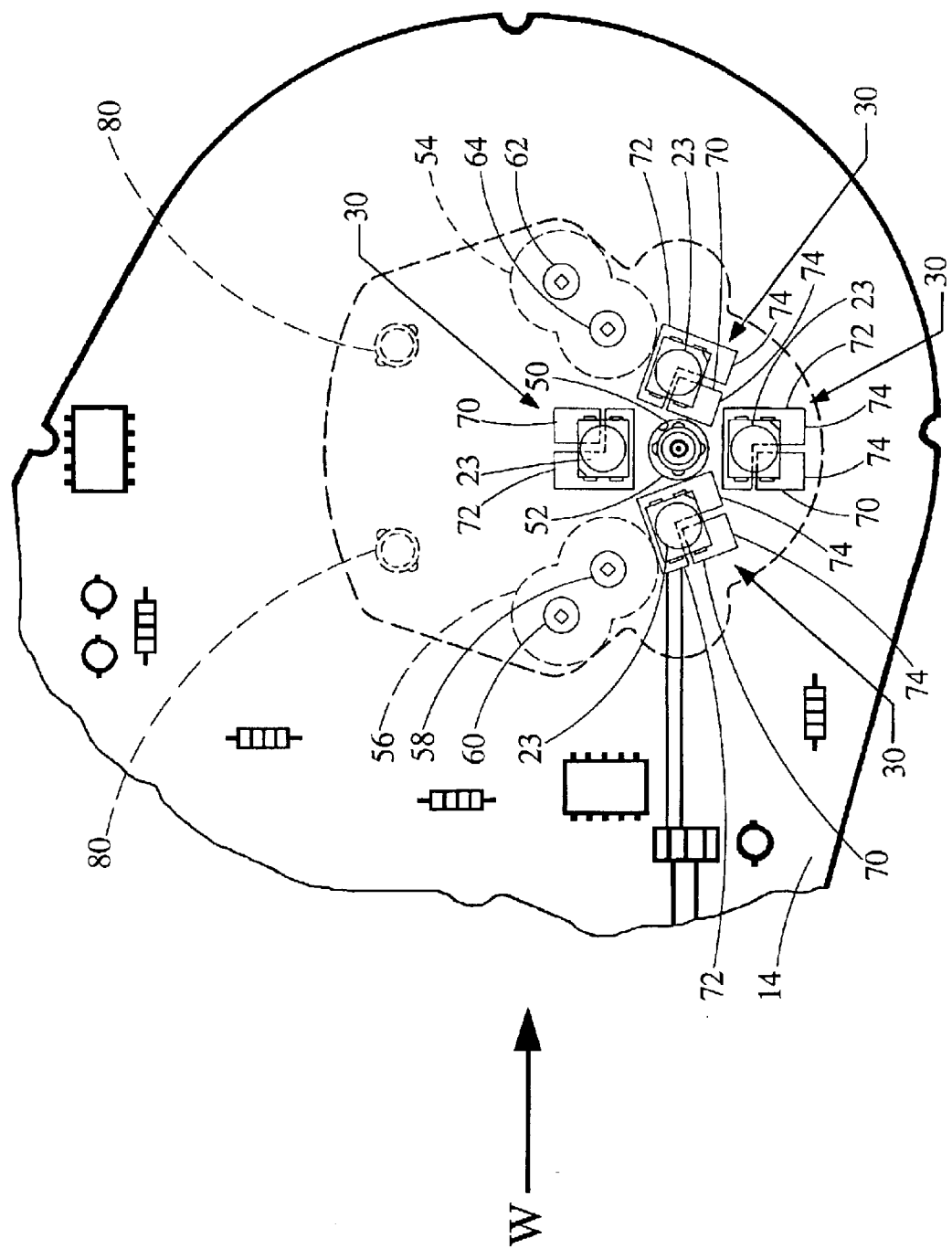
FIG. 3 is a magnified view of a portion of an instrument cluster circuit board illustrating a four LED design for use in a wave solder process, in accordance with the present invention.

Referring now to FIG. 3, a magnified view of a portion or area of circuit board 14 is illustrated showing diode "footprints" 30 for electrically interconnecting diodes 23 to circuit board 14, in accordance with the present invention. Diode "footprints" 30 are positioned around an aperture 50 through which shaft 28 of the stepper motor 26 extends. In order to sufficiently illuminate pointer 22, mounted to stepper motor shaft 28, a minimum distance between the center of shaft 28 and the center of the LED should be maintained. In addition to the space constraints, diode "footprints" 30 also must not encroach on keep-outs 54 and 56. Keep-outs 54 and 56 are, for example, areas on circuit board 14 where the electrical power connections 58, 60, 62 and 64 interconnect to the circuit board.

The present invention contemplates electrically interconnecting diodes 23 to diode "footprints" 30 using a conventional wave solder manufacturing technology. However, in order to utilize wave soldering processes, in an embodiment of the present invention, a particular diode "footprint" configuration is provided. Moreover, in another embodiment of the present invention, a diode "footprint" orientation with respect to the wave solder flow direction, as indicated by arrow W, is also provided. Diode "footprint" 30 includes an anode solder pad 70 and a cathode solder pad 72. Anode solder pad 70 is substantially rectangular, while cathode solder pad 72 is L-shaped and extends around two sides of anode solder pad 70. Further, to ensure solder adhesion to both anode solder pad 70 and cathode solder pad 72 of diode "footprint" 30, leading edges 74 of each solder pad should be inclined with respect to the solder wave of solder wave process (as indicated by arrow W). For example, diode "footprint" 30 should be oriented or rotated between 90° and 110° with respect to the solder wave direction W.

Thus, the present invention has many advantages and benefits over the prior art. For example, in an embodiment of the present invention, a diode "footprint" configuration is provided that may be used in applications requiring as few as one LED or a plurality of LEDs such as four. Further, a diode "footprint" orientation with respect to a wave solder direction is provided that insures adequate solder coverage. Moreover, the present invention provides a diode "footprint" design and method for soldering components to same that enables the use of higher power components, such as high output LEDs. Use of high output LEDs allows vehicle instrument panel and instrument cluster designers to incorporate instrument cluster lenses made of semi-transparent (darker) materials.

As any person skilled in the art of systems and methods for soldering LEDs on circuit boards for use in automobile instrument cluster and for forming the electrical interconnection of the LEDs to the circuit boards will recognize from the previous detailed description and from the figures and claims, modifications and changes can be made to the preferred embodiments of the invention without departing from the scope of this invention defined in the following claims.

We claim:

1. An instrument cluster for communicating a vehicle's operating status to a vehicle occupant, the instrument cluster comprising:
    a housing for supporting the instrument cluster, wherein the housing is mountable to a vehicle instrument panel;
    a circuit board secured to the housing;
    a motor having a motor shaft rotatably coupled to the motor, wherein the motor is secured to the circuit board;
    a gauge pointer mounted on the motor shaft and rotatable therewith for indicating the vehicle's operating status;
    at least one diode for illuminating the gauge pointer; and
    at least one diode footprint disposed on the circuit board proximate the motor shaft for electrically interconnecting the at least one diode to the circuit board, the at least one diode footprint having a cathode solder pad and an anode solder pad, wherein at least one of the anode solder pad and the cathode solder pad is substantially L-shaped.

2. The instrument cluster of claim 1 further comprising a pair of mechanical supports attached to the motor housing for securing the circuit board to the motor housing.

3. The instrument cluster of claim 1 wherein the circuit board further comprises a plurality of electrical connections for coupling an external power source to the motor.

4. The instrument cluster of claim 1 further comprising two diode footprints disposed on the circuit board adjacent the motor shaft.

5. The instrument cluster of claim 4, wherein the two diode footprints are adjacent one another.

6. The instrument cluster of claim 1 further comprising three diode footprints disposed on the circuit board adjacent the motor shaft.

7. The instrument cluster of claim 6 wherein the three diode footprints are 120° apart from each other.

8. The instrument cluster of claim 1 further comprising four diode footprints disposed on the circuit board adjacent the motor shaft.

9. The instrument cluster of claim 8 wherein the four diode footprints are 90° apart from each other.

10. A method of wave soldering an electronic component on an instrument cluster circuit board, the method comprising:

provingding at least one electronic component footprint for electrically interconnecting the electronic component to the circuit board;

orienting the at least one electronic component footprint between 90° and 110° with respect to a solder wave direction; and exposing the electronic component and electronic component footprint to a wave soldering process to electrically interconnect the electronic component to the electronic component footprint.

11. The method of claim 10, wherein orienting further comprises orienting an L-shaped solder pad portion of the electronic component footprint between 90° and 110° with respect to the wave solder direction.

12. The method of claim 10, wherein orienting further comprise orienting a rectangular solder pad portion of the electronic component footprint between 90° and 110° with respect to the wave solder direction.

* * * * *